United States Patent
Pagani et al.

(10) Patent No.: US 9,464,952 B2
(45) Date of Patent: Oct. 11, 2016

(54) INTEGRATED ELECTRONIC DEVICE FOR MONITORING MECHANICAL STRESS WITHIN A SOLID STRUCTURE

(71) Applicant: STMICROELECTRONICS S.R.L., Agrate Brianza (IT)

(72) Inventors: Alberto Pagani, Nova Milanese (IT); Federico Giovanni Ziglioli, Pozzo d'adda (IT); Bruno Murari, Monza (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 325 days.

(21) Appl. No.: 14/108,951

(22) Filed: Dec. 17, 2013

(65) Prior Publication Data

US 2014/0182390 A1    Jul. 3, 2014

(30) Foreign Application Priority Data

Dec. 27, 2012  (IT) ................. M2012A2241

(51) Int. Cl.
| | |
|---|---|
| *G01M 5/00* | (2006.01) |
| *G01B 5/30* | (2006.01) |
| *G01B 7/16* | (2006.01) |
| *G01L 1/00* | (2006.01) |
| *G01N 3/00* | (2006.01) |
| *G01L 1/18* | (2006.01) |
| *H01L 27/20* | (2006.01) |

(52) U.S. Cl.
CPC ......... *G01L 1/18* (2013.01); *H01L 27/20* (2013.01)

(58) Field of Classification Search
None
See application file for complete search history.

(56) References Cited

U.S. PATENT DOCUMENTS 4,770,050 A * 9/1988 Hafner ............... B29C 37/006
 338/2
5,199,298 A * 4/1993 Ng ...................... G01N 11/00
 73/147

(Continued)

FOREIGN PATENT DOCUMENTS

| EP | 0735352 A2 | 10/1996 |
| WO | 2012084295 A1 | 6/2012 |

OTHER PUBLICATIONS

Kuo et al.—Smart-Cut™ Piezoresistive Strain Sensors for High Temperature Applications, IEEE Sensors 2009 Conference, Oct. 25-28, 2009, pp. 1290-1292.

*Primary Examiner* — Michael A Lyons
*Assistant Examiner* — Jermaine Jenkins
(74) *Attorney, Agent, or Firm* — Allen, Dyer, Doppelt, Milbrath & Gilchrist, P.A.

(57) ABSTRACT

The integrated electronic device is for detecting a local parameter related to a force observed in a given direction, within a solid structure. The device includes at least one sensor configured to detect the above-mentioned local parameter at least in the given direction through piezo-resistive effect. At least one damping element, integrated in the device, is arranged within a frame-shaped region that is disposed around the at least one sensor and belongs to a substantially planar region comprising a plane passing through the sensor and perpendicular to the given direction. Such at least one damping element is configured to damp forces acting in the planar region and substantially perpendicular to the given direction.

27 Claims, 12 Drawing Sheets

(56) References Cited

U.S. PATENT DOCUMENTS

| | | | |
|---|---|---|---|
| 5,499,535 A * | 3/1996 | Amano | G01D 5/48 73/717 |
| 5,659,196 A * | 8/1997 | Honda | G01P 15/123 257/415 |
| 6,082,200 A | 7/2000 | Aslam et al. | |
| 6,300,223 B1 | 10/2001 | Chang et al. | |
| 6,300,233 B1 | 10/2001 | Lee et al. | |
| 6,492,716 B1 | 12/2002 | Bothra et al. | |
| 6,709,954 B1 | 3/2004 | Werking | |
| 6,722,212 B2 | 4/2004 | Specht | |
| 6,732,592 B1 | 5/2004 | Blackburn et al. | |
| 6,747,399 B1 * | 6/2004 | Ogino | B60J 10/00 310/319 |
| 6,753,608 B2 | 6/2004 | Tomita | |
| 6,787,054 B2 | 9/2004 | Wang et al. | |
| 6,841,455 B2 | 1/2005 | West et al. | |
| 6,950,767 B2 | 9/2005 | Yamashita et al. | |
| 6,960,496 B2 | 11/2005 | Chen et al. | |
| 7,224,042 B1 | 5/2007 | McCollum | |
| 7,242,286 B2 | 7/2007 | Knox | |
| 7,357,419 B2 | 4/2008 | Kock et al. | |
| 7,716,984 B2 * | 5/2010 | Sakaguchi | G01P 1/023 73/514.33 |
| 7,752,925 B2 | 7/2010 | Koors et al. | |
| 7,806,007 B2 | 10/2010 | Murphy et al. | |
| 8,474,318 B2 * | 7/2013 | Kazama | G01P 15/123 73/514.33 |
| 8,671,754 B2 * | 3/2014 | Hum | G01L 19/04 73/431 |
| 8,978,483 B2 | 3/2015 | Pagani et al. | |
| 2007/0255509 A1 * | 11/2007 | LeFebvre | B61F 5/305 702/33 |
| 2011/0239783 A1 | 10/2011 | Kurtz et al. | |
| 2014/0264657 A1 | 9/2014 | Gogoi | |

* cited by examiner

INTEGRATED ELECTRONIC DEVICE FOR MONITORING MECHANICAL STRESS WITHIN A SOLID STRUCTURE

FIELD OF INVENTION

The present invention relates to integrated electronic devices for detecting a locally observed force and/or pressure and/or mechanical stress, within a solid structure, in a specific direction. A system for monitoring a force and/or pressure and/or mechanical stress, within a solid structure, using the above-mentioned device is also included.

BACKGROUND OF THE INVENTION

In solid structures, in particular in load-bearing structures of, for example, bridges, buildings, tunnels, railways, containment walls, dams, embankments, slabs and beams of buildings, underground piping and structures of urban subways, and the like, it is very important to monitor, in several points, significant parameters, particularly mechanical stresses (and thus those forces and/or pressures causing the stresses) to which the structure is subjected in those points. In the present description, solid structures are considered such as structures made from building material, for example cement, concrete, mortar.

Such a monitoring action, which is carried out either periodically or continuously, is useful both in an initial step and during the life time of the structure.

To this purpose, it is known the use of electronic monitoring devices based on electronic sensors, which are capable of providing good performances at low cost. Usually, these devices are applied to the surface of the structure to be monitored, or within recesses that are already provided in the structure and are accessible from the outside.

To enhance the monitoring performance, in view of an evaluation of the structure quality, safety, ageing, reaction to varying atmospheric conditions, and the like, approaches have been also carried out which provide electronic monitoring devices that are completely embedded, e.g. "buried" into the material (for example reinforced concrete) of which the structure to be monitored is made. Among those, a device is described in U.S. Pat. No. 6,950,767, which is actually a whole system encapsulated in one container, which includes several parts, assembled on a substrate, such as integrated circuits, sensors, antennas, capacitors, batteries, memories, control units and the like, which are fabricated in different "chips" that are connected to each other via electric connections provided with metal linkages.

As a whole, U.S. Pat. No. 6,950,767 describes an approach of the "System in Package" (SiP) type. However, it should be understood that a SiP, which is intended to be first "drowned" in a construction material (e.g. liquid concrete, which will then solidify) and then remain "buried" within the solid structure, is subjected to adverse conditions, for example due to very high pressures, which can even be as high as several hundreds of atmospheres. In addition, a number of other causes of wear exist, over time, for example, due to water seepages, which can damage the system.

In view of the above, the level of reliability of a SiP such as the one described in U.S. Pat. No. 6,950,767 may not be fully satisfactory.

A further approach is represented by devices such as those described in the international patent application WO 2012/084295, of the present Assignee. WO 2012/084295 describes a device for the detection and monitoring of one or more local parameters within a solid structure, comprising an integrated detection module, in which at least one integrated sensor and the circuitry thereof, as well as an electromagnetic unit, for communication to and from the outside, are provided. The integrated detection module further comprises a passivation layer which completely covers the integrated sensor and the circuitry thereof, such that the integrated detection module is completely hermetically sealed and galvanically insulated from the surrounding environment.

The device in WO 2012/084295 ensures the required functionality with a satisfactory level of reliability and robustness relative to the above-mentioned causes of wear. It can therefore be used for detecting a mechanical stress and/or a force and/or a pressure within the solid structure to be monitored, at the point where it is positioned. With reference to the detection of mechanical stress, the device in WO 2012/084295 employs sensors of pressure (thus, also of force, and also of mechanical stress) which operate based on the piezo-resistivity phenomenon.

As known, and as will be better illustrated herein below, the piezo-resistivity, i.e. piezo-resistive effect, defines a dependence between an electric signal generated by a piezo-resistive sensor and a mechanical stress (i.e., strain, i.e., compression or tension) experienced by the sensor material (e.g., silicon). The mechanical stress can be, in turn, representative of a pressure and/or force to which the sensor is subjected. The sensitivity, intended as the ratio of the force applied to the electric signal generated, depends on the reaction of the material (silicon) to the stresses, which, in turn, depends on the crystal orientation of the silicon. The sensitivity is thus a function of the direction along which the force, and the consequent mechanical stress, are applied.

An example of a diagram of angular sensitivity (piezo-resistive coefficient of the silicon) is illustrated in FIG. 1A. This figure will be described in greater detail below. For the present purpose of outlining the technical problem addressed by the present embodiments, it should be simply assumed that the vertical axis of FIG. 1A, referred to as [001], coincides with the vertical axis, which is properly intended as the direction along which the force of gravity acts. This corresponds to orientating the sensor, based on the crystal orientation thereof, so that a main sensitivity lobe is aligned with the direction of action of the force of gravity. Thereby, the mechanical stress corresponding to the force applied by the weight of the structure, in the monitoring point, can be detected with good approximation. This is useful, because, usually, the weight of the structure is the more relevant force in play, and is often also the one that is desired to be detected.

However, what is actually measured by a sensor, such as that in WO 2012/084295, does not correspond exactly to the vertical component of the force, but is also affected by any "horizontal" component, i.e., a component acting on a "horizontal" plane, orthogonal to said vertical direction. From FIG. 1A, which substantially shows a section along a plane orthogonal to the "horizontal" one, it can be observed that sensitivity lobes also exist in the direction [010].

More specifically, FIG. 1B shows the sensitivity lobes on the "horizontal" plane, orthogonal to the sectional plane in FIG. 1A, in the directions [100] and [010]. As a whole, FIGS. 1A and 1B illustrate the "three-dimensional" dependence of the sensitivity on mechanical stress (compression or tension) experienced by the sensor, as a function of a force and/or pressure that is applied in any direction. This dependence may be also figured as a three-dimensional diagram, in which the volumetric lobes are shown as being similar to rotational ellipsoids.

Now, the overall intensity as measured by prior art devices, such as those mentioned above, comprises a contribution deriving from the vertical component of the force (towards which the main sensitivity lobe is orientated in the direction [001]), but also a contribution deriving from the horizontal (or "lateral", in an equivalent definition) component of the force, on the plane orthogonal to the direction [001], depending on the angle of application of such a force relative to the crystal orientation, as shown in FIG. 1B. Therefore, the prior art sensors measure the resulting force at the point where the sensor is positioned.

If it is desired to detect the vertical component of the force, and in case this component (weight force) is much greater than the lateral component, the intensity, as detected by the sensors of the prior art devices, is a good approximation of the result that is desired to be achieved. However, the following drawbacks will usually arise: i) as stated above, the result of the sensor measurement does not correspond to the vertical component; ii) the result of the sensor measurement may not correspond even to the actual intensity of the force, as the two vertical and transversal components may result as being weighted differently by different sensitivity values; iii) is not possible to differentiate the two components, nor measure them separately; and iv) in case the lateral force is desired to be measured, this cannot be done by simply orientating the sensor so as to align the direction of maximum sensitivity with one of the axes or [100]. In fact, in this case, the result would be influenced also by the component along the axis [001], which in this example is aligned with the vertical direction, and thus is affected by the weight of the structure, which may totally impair the correctness and accuracy of the result.

With particular reference to the drawback iv), there emerges an aspect related to the requirement of also measuring the lateral forces. In fact, generally, the building structures to be monitored may be anisotropic systems, wherein each point may be subjected to forces/stresses in different directions, i.e., to forces/stresses having at least two components which are desired to be measured separately. By way of example, a load bearing column of a structure, or a bridge pillar can be mentioned.

Particularly, the designers and the maintenance operators of such a type of solid structure need to know also the lateral mechanical stresses (flexural, compression or tension stresses) that are present in those points to be monitored, which are due for example to wind or to particular structural configurations. The information deriving from the knowledge also of the lateral stresses may be crucial for effective monitoring and maintenance of the solid structure to be monitored. From the above, it should be understood that a desire may be strongly felt to improve the accuracy and correctness of detection, and particularly to allow individual detections of both the lateral and the vertical components of the mechanical stress, or in other words, to detect the component of the force applied to a point in a specific direction of interest (i.e., in a given direction). This desire, due to the above reasons, may not met by the prior art devices mentioned above.

SUMMARY OF THE INVENTION

An object of the present embodiments is to devise and provide an improved integrated electronic device for detecting a force and/or pressure and/or mechanical stress, within a solid structure, such as to at least partially overcome the drawbacks described above with reference to the prior art.

This object is achieved with an integrated electronic device for detecting a local parameter related to a force observed in a given direction, within a solid structure. The device includes at least one sensor configured to detect the above-mentioned local parameter at least in the given direction through piezo-resistive effect. At least one damping element, integrated in the device, is arranged within a frame-shaped region that is disposed around the at least one sensor and belongs to a substantially planar region comprising a plane passing through the sensor and perpendicular to the given direction. Such at least one damping element is configured to damp forces acting in the planar region and substantially perpendicular to the given direction.

BRIEF DESCRIPTION OF THE DRAWINGS

Further characteristics and advantages of the integrated electronic detecting device, according to the invention, will appear from the description below of preferred exemplary embodiments, which are given by way of non-limiting illustration, with reference to the annexed figures, in which.

DETAILED DESCRIPTION OF THE PREFERRED EMBODIMENTS

Prior to the description of the device according to the invention, it is useful to recall some principles relevant to the piezo-resistive effect (on which the force/pressure sensors comprised in the device are based, as will be illustrated below), and to establish some conventions related to the space reference systems being considered herein. A pressure sensor of the type described herein is capable of converting a pressure value to an electric variable, for example by exploiting the known variations that the mechanical stress caused by the pressure on the semiconductor (e.g., silicon) induces for example to the mobility of electrons/holes in the same semiconductor.

Figure 1A:
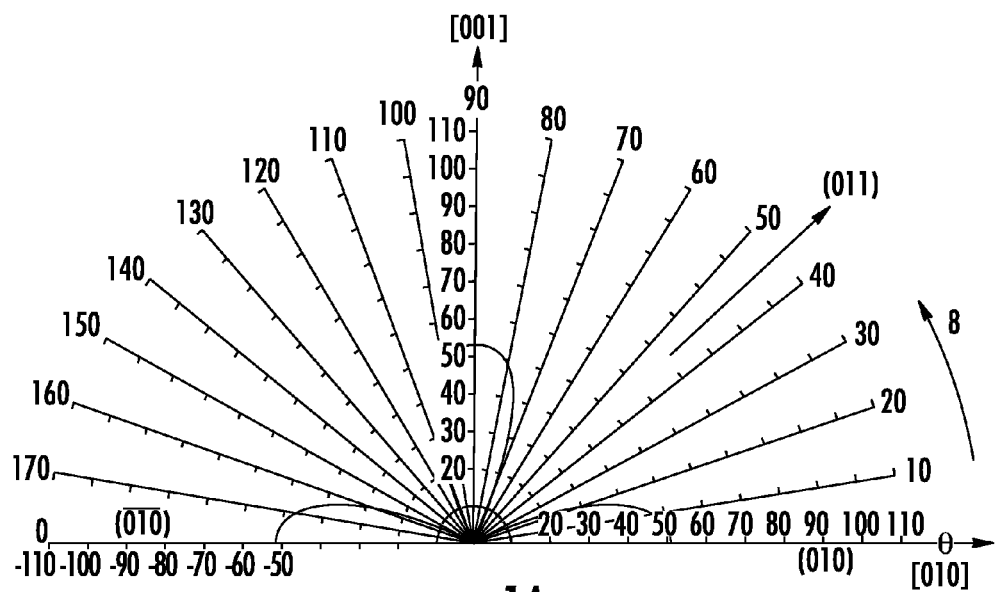
FIGS. 1A and 1B are sensitivity diagrams (i.e., piezo-resistive coefficients) of a sensor within the device according to the invention, which diagrams relate to two planes orthogonal to each other, respectively.

It is known, to this purpose, that the mobility depends on the pressure in a manner dependent on the crystalline orientation of the semiconductor material, according to the laws that regulate the piezo-resistivity phenomenon. Particularly, with reference to Miller indices, using common notations in the context of the definition of planes and axes characterizing a crystal, let us consider an N-type crystal (similarly, for a P-type crystal) in the plane defined by the crystalline axes and [010]: in such an example, illustrated in FIG. 1A, the sensitivity to the mechanical stress, i.e., to the pressure, is maximum if such a stress is applied along axes [001] and [010] relative to a reference system associated with the crystalline orientation, whereas it is minimum along axes [011]; the angular behavior for each angle θ is shown in FIG. 1A. To detect the pressure and/or force acting in a certain given direction, the sensor should be positioned so that such given direction coincides with the axis of maximum sensitivity (or with one of the axes of maximum sensitivity): for the sake of descriptive clarity, it will be assumed that this axis is always [001], but it should be understood that the description can be easily generalized in case of conventionally different notations.

Regarding the reference system x-y-z relative to which the detection direction is defined, the convention that will be used throughout this description is designating the vertical axis (the one on which the force of gravity acts) with "z" and axes orthogonal to "z" as axes "x" and "y", thus defining a horizontal plane. A force acting on a point of a solid structure will be thus divided in two components, a vertical component $F_z$, and a horizontal component $F_{xy}$.

Figure 1B:
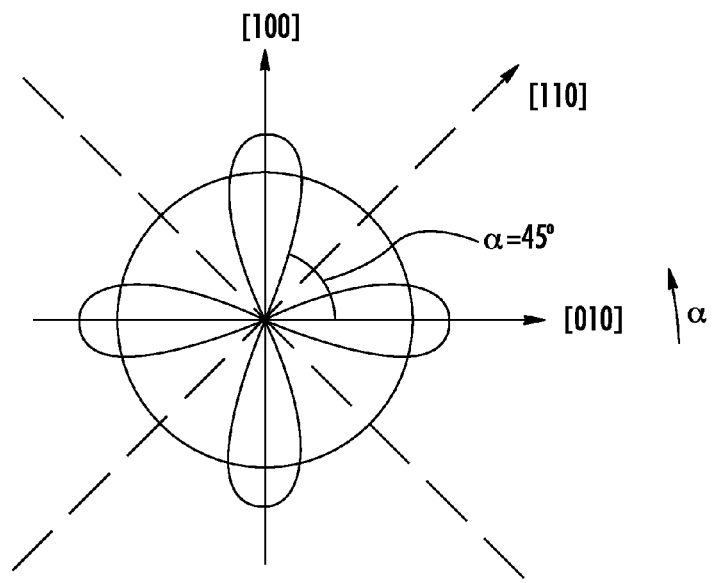

FIG. 1B shows the sensitivity lobes on the plane perpendicular to the one shown in FIG. 1A, i.e., relative to the crystalline axes, on the plane containing the axes and [010]. If it is assumed that the axis z is aligned with the crystal axis [001], the diagram of FIG. 1B illustrates the effect of the horizontal component $F_{xy}$ of the force, depending on the angle φ formed by the direction of application of such a force relative to the axis [010], on the plane [010]-[100]. By way of example, minimum sensitivity directions [110], wherein φ=45°, are shown with a dashed line in FIG. 1B. Under the same convention, the diagram of FIG. 1A illustrates the effect of the vertical component $F_z$ of the force, depending on the angle θ formed by the direction of application of such a force relative to the axis [010], on the plane [010]-[001].

As a whole, FIGS. 1A and 1B illustrate the "three-dimensional" dependence of the sensitivity on the mechanical stress, i.e. compression or tension, as experienced by the sensor, as a function of a force and/or pressure being applied in any direction. This dependence could be also figured as a three-dimensional diagram, wherein the volumetric lobes are shown as rotational ellipsoids.

In other words, the piezo-resistive structures made from the semiconductor material of the chip, and then integrated in the integrated device, according to the invention, are sensitive to the pressures, and therefore to the forces, to which all the surfaces of the device are subjected, in terms of both tension and compression. If it is assumed that these piezo-resistive structures, particularly the sensor, are made of silicon, it can be observed that the relationship between a generated electrical signal and an applied stress is almost perfectly linear, both on the positive axis (compression) and on the negative axis (tension), even at very high stress values.

Figure 2:
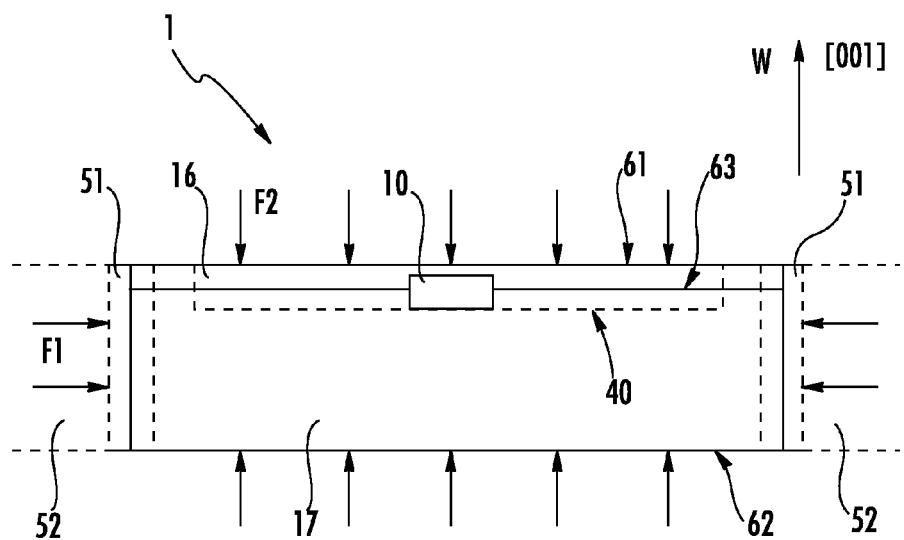
FIG. 2 is a cross-sectional view illustrating a principle according to which the device according to the invention has been developed.
Figure 3:
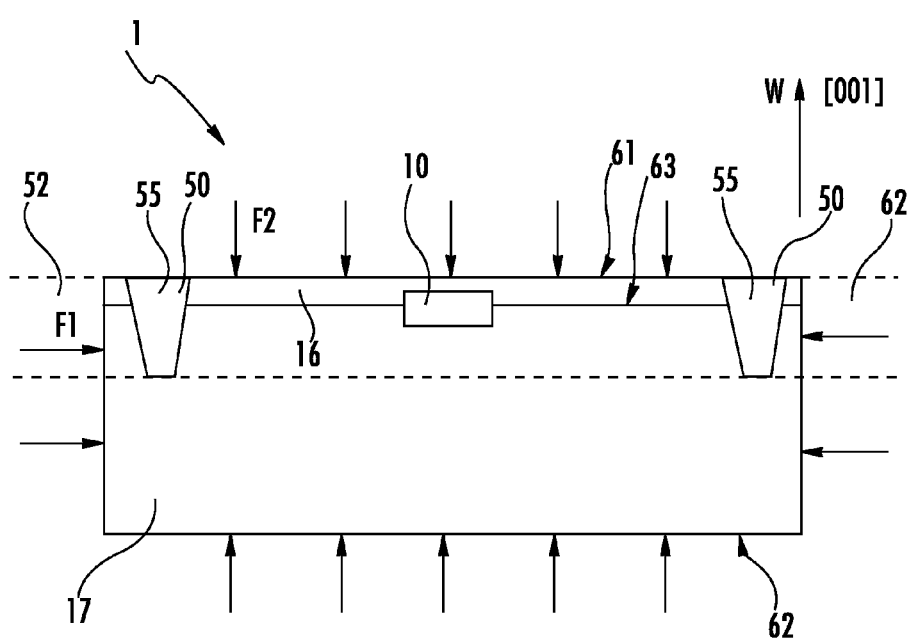
FIGS. 3, 4 and 5A and 5B are cross-sectional views of respective embodiments of a device according to the invention.
Figure 4:
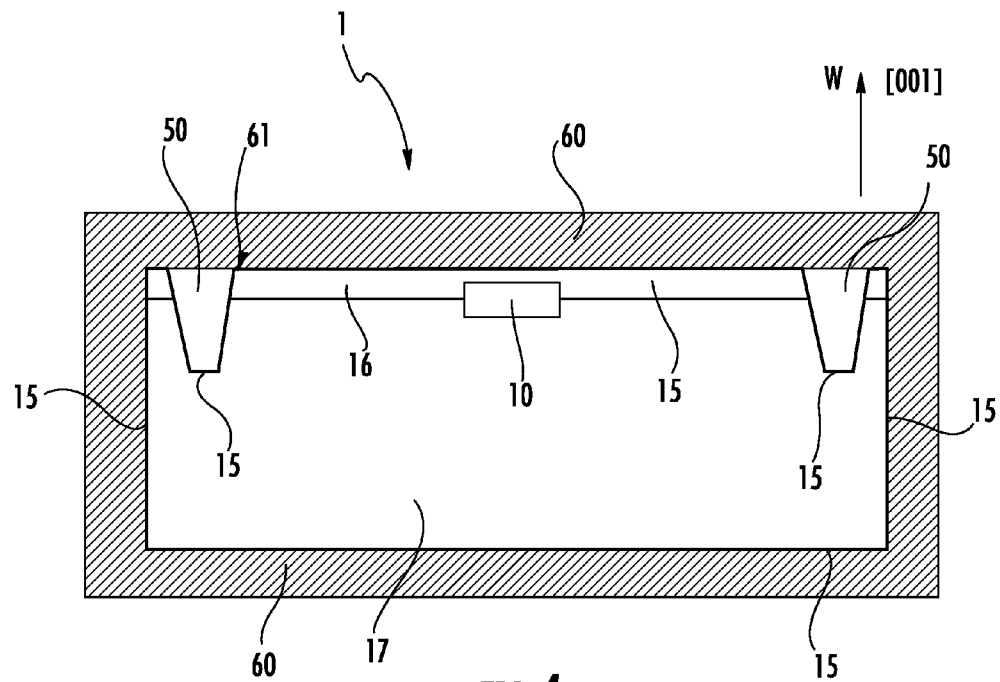

With reference now to FIGS. 2 and 3, it is described an integrated electronic device 1 for detecting a local parameter related to a force observed (i.e., acting) in a given direction, within a solid structure according to an example of the present invention. Such device, for the sake of simplicity, will be also designated herein below as "detecting device".

The detecting device 1 comprises at least one sensor 10, configured to detect, through piezo-resistive effect, a local parameter related to a force (for example $F_2$) observed in a given direction "w" (also designated as [001], consistently with the convention introduced above). The detecting device 1 further comprises at least one damping element 50, integrated in the device 1, which is arranged within a frame-shaped region 51 disposed (i.e., situated) around the at least one sensor 10; the frame-shaped region 51 belongs to a substantially planar region 52 comprising a plane passing through the sensor 10 and perpendicular to the above-mentioned given direction "w". The at least one damping element 50 is configured to damp forces $F_1$ acting in this planar region 52 and substantially perpendicular to the given direction "w", relative to which the detection is desired to be carried out.

With "local parameter related to a force" is meant for example a force or a pressure, or even a mechanical stress, of compression or tension, which is caused by such a force or such a pressure. The sensor 10 is thus a sensor of force and/or pressure and/or mechanical stress, exploiting the piezo-resistive effect, and behaves according to what has been described above, with reference to the FIGS. 1A and 1B.

It should be noted that such sensor can be manufactured for example via a portion of silicon in crystalline form, having well-determined crystalline axes with known orientation. Furthermore, the sensor can be implemented via electronic structures per se known: for example, a pressure sensor can be formed with four resistors integrated in Wheatstone bridge configuration, wherein two pressure-sensitive resistors are oriented along the axes [100] and [010] associated with the crystalline orientation, whereas the other two are orientated along the axes [110], which orientation coincides with the angle of the minimum sensitivity axis of the piezo-resistive effect. The output signal from this structure is representative of the force and/or pressure detected. Furthermore, the above-mentioned structure is capable of reducing and possibly neutralizing further temperature-dependent effects, thereby providing a reliable result. Further known structures for providing this sensor are described for example in the above-mentioned international patent application WO 2012/084295 of the Assignee.

The at least one damping element 50 is arranged within a frame-shaped region (illustrated with a broken line as 51 in the sectional view of FIG. 2) situated around the sensor 10. This frame-shaped region 51 completely surrounds the sensor 10 on a plane perpendicular to the given direction "w" of the force component that is desired to be detected. In other words, the frame-shaped region 51 belongs to a substantially planar region (also illustrated with a broken line, with numeral 52 in FIGS. 2 and 3) comprising a plane passing through the sensor 10 and perpendicular to the above-mentioned given direction. The substantially planar region 52 is defined as such because it mainly extends along the plane passing through the sensor perpendicular to the given direction "w", but has a certain thickness in the same given direction "w".

According to an embodiment, the at least one damping element 50 comprises a plurality of walls 53 (illustrated for example in FIG. 7) which are placed within the frame-shaped region 51; or, several damping elements 50 may be provided, each being formed by one of the walls 53. In accordance with another embodiment (illustrated for example in FIG. 9), the walls 53 of the damping element form a frame 54 completely surrounding the sensor, and developing for example along the perimeter of a polygon or a ring. In this case, the damping element 50 can therefore comprise a structure of damping material, having the shape of a ring or of a polygonal perimeter of any polygon. Therefore, it should be observed that the two portions 50 of the damping element illustrated in the sectional view of FIG. 3 may belong (in different embodiments) to one damping ring, developing about the sensor, or to at least two different walls.

The damping element 50 is formed of damping material, capable of damping, i.e., attenuating, the forces acting thereon (e.g., due to elastic properties). The damping effect corresponds to an absorption and thus attenuation effect (up to a substantial reduction to zero) of said forces. Such damping material will be characterized in greater detail herein below, and some options relevant to the configuration of the damping element/s will be better illustrated.

However, it can already be understood, from the characteristics described above, that the at least one damping element 50 is configured to damp forces ($F_1$) acting in the substantially planar region 52 and substantially perpendicular to the given direction "w" relative to which the detection is desired to be carried out.

With further reference to FIG. 2, it should be noted that the device 1 is configured to detect the force $F_2$ acting in the direction [001], by neutralizing the effect of the forces $F_1$ acting on a plane perpendicular to this detection direction, the plane being defined by the axes [010] and [100] (obviously, only [010] can be seen in the sectional view).

Therefore, if the crystalline axis [001] is oriented at the Cartesian axis z (i.e., "w" coincides with "z"), the device 1 will precisely and only detect the vertical component of the force, which in this case is $F_2$. If, on the other hand, the crystalline axis [001] is oriented along an axis of the horizontal plane (i.e., "w" coincides for example with "x" or "y"), the device will precisely and only detect the horizontal, i.e. lateral, component of the force, which in this case is $F_1$. Thereby, the object of the invention is achieved.

The neutralization of the undesired component occurs due to the geometric configuration and the physical properties of the at least one damping element: the physical properties of elasticity/flexibility allow to absorb, i.e. to damp, an applied force in such a way that it is not perceived by the sensor, or, at least, that is experienced with a drastically reduced strength; the geometric configuration allows to select as the forces to be damped those forces ($F_1$) acting on a plane perpendicular to that of the detection direction "w".

Therefore, the geometric configuration of the at least one damping element is such as to shield the sensitivity lobes of the sensor 10 in the directions orthogonal to the detection direction. In other words, the damping elements 50 can be viewed as "lateral" structures of the integrated device, which are configured to reject the "lateral" forces (orthogonal to the direction "w") to which the "lateral" surface of the integrated device is subjected, thereby allowing the sensor 10, integrated in the device, to measure only the force component in the desired direction "w" (i.e., with reference to the FIGS. 2 and 3, the forces $F_2$ applied to the upper and lower surfaces of the device).

Again with reference to FIG. 3, it can be observed that the device 1, according to an embodiment, comprises grooves 55 (or cavities 55, or trenches 55), which are provided within the frame-shaped region 51, having various shape (e.g., a parallelepiped; or, as in the example of FIG. 3, a truncated pyramid having a trapezoid section, or other types, for example triangular or rectangular). These grooves 55 can be obtained in various manners, which are known per se, for example by etching incisions in the silicon, having a controlled shape and size.

In accordance with an embodiment of the device, these grooves are filled with damping material (e.g., elastic material) upon manufacturing. Thereby, each damping element 50 results to be formed by a groove filled with damping material. Therefore, the presence of a groove filled with a flexible/elastic material reduces the transmission of the lateral stress due to the component of the force to be rejected ($F_1$), right in the substrate portion 17 where the sensor 10 is positioned.

With further reference to FIGS. 2 and 3, it should be noted that the integrated electronic detecting device 1 further comprises a substrate 17 of semiconductor material, for example silicon, and an integrated functional circuitry 40, a portion of which forms the sensor 10. The functional circuitry 40 is integrated in the substrate 17 starting from a surface thereof, which we define as the upper surface 63, and is provided with connecting lines that are comprised in a layer of dielectric or insulating material 16 and includes different levels of metallization connected by conductive ways, exploiting known microelectronic techniques.

To the purposes of the present description, by "integrated functional circuitry" is meant the portion of the integrated electronic detecting device 1 which is suitable to implement the functional blocks comprised in the device, such as those illustrated in the functional diagram illustrated in FIG. 14, and described herein below. The integrated functional circuitry 40 comprises an integrated antenna 11 made from the material 16.

The integrated antenna 11 performs the function of wirelessly transmitting, to the outside of the detecting device 1, the data being measured, i.e. the intensity of each of the electrical variables, dependent on and representative of a respective one among the physical quantities (force and/or pressure and/or mechanical stress) to be detected and monitored. The integrated antenna 11 also performs the function of receiving operating commands from the outside. Furthermore, the integrated antenna 11 can perform the further function of receiving radio-frequency waves necessary for remote power supplying (i.e. a "contactless power supply") to the detecting device 1, without requiring batteries or a power supply on site.

Figure 14:
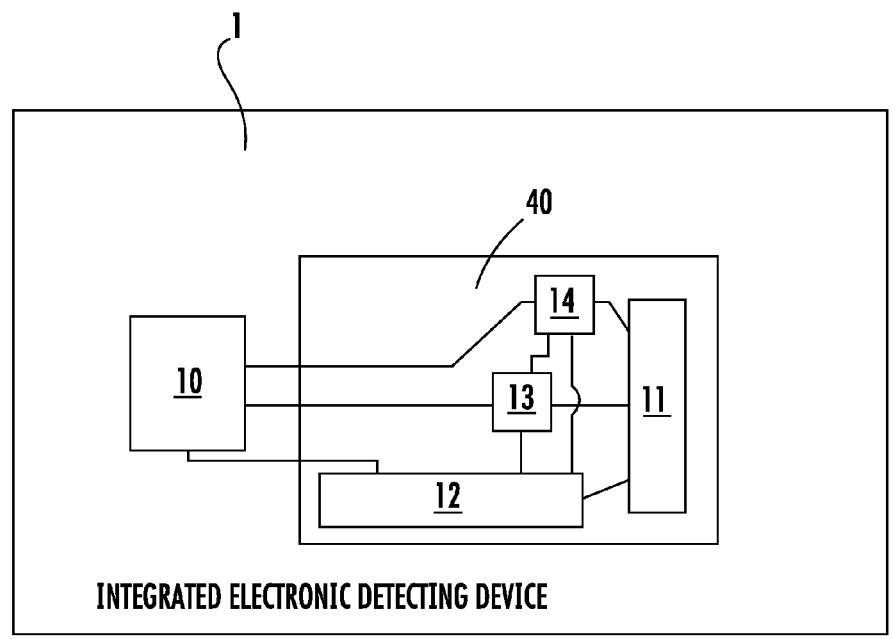
FIG. 14 is a block diagram illustrating an electronic detecting device according to an example of the invention.

According to an embodiment, illustrated in FIG. 14, the integrated functional circuitry 40 comprises, as auxiliary blocks, a power supply circuit 12, a driving circuit 13 and a control circuit 14. The power supply circuit 12 is suitable to get the electrical power supply, required for the operation of the detecting device 1, from radio-frequency waves received by the integrated antenna 11. The driving circuit 13 is suitable to drive the integrated antenna 11 so that it transmits the measured data in wireless mode. The control circuit 14 is suitable to control the operation of the integrated functional circuitry provided in the device 1, according to what is dictated by operating commands that are sent from the outside and received by the integrated antenna 11.

The power supply circuit 12, the driving circuit 13 and the control circuit 14 can be made via circuits per se known, in the context of "Smart Card" manufacturing technologies or RFID (Radio Frequency Identification) technology; for example, the integrated antenna 11 can operate based on load modulation techniques. These known aspects will not be described herein in detail.

In accordance with an embodiment, the detecting device 1 further comprises a passivation layer 15 (that can be seen for example in FIGS. 4, 5A, 10, 11). This passivation layer 15 is an impermeable and protective layer, which is suitable to completely coat at least the sensor 10 and the integrated functional circuitry 40, or preferably the whole chip through which the device is implemented, such that the detecting device 1, as a whole, is entirely hermetically sealed and galvanically insulated from the surrounding environment. The passivation layer 15 must at least cover a functional surface 61 (which we will designate as the upper surface) of the detecting device 1, which surface faces the outside of the chip, and is proximate or coincident with a surface of said integrated functional circuitry.

Such passivation layer 15, in different exemplary embodiments encompassed by the invention, can be made from silicon oxide, or silicon nitride, or silicon carbide. In a particular embodiment, the passivation layer 15 is surrounded by building material 60, having suitable microgranularity and homogeneity properties, and compatible with the material forming the structure to be monitored.

With reference now to FIGS. 5A to 11, several embodiments of the detecting device according to the invention will be described, which are different from each other for some details in the structural configuration thereof.

Figure 5A:
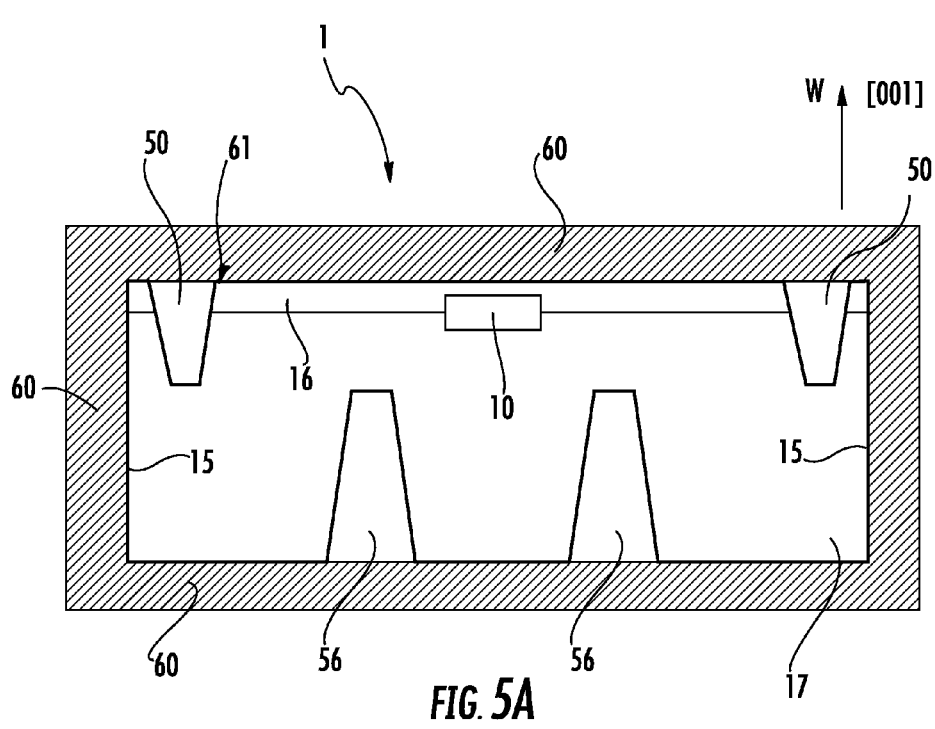

The device illustrated in FIG. 5A comprises the damping elements 50, in the chip forming the detecting device 1, within the substrate 17; the damping elements 50 are built starting from the upper surface 61. In addition, the device 1 comprises further damping elements 56, within the substrate 17, in different regions than the frame-shaped region 51, thus, not around the sensor 10. In the example shown in FIG. 5A, the further damping elements 56 consist of grooves or cavities, which are built starting from a surface of the substrate 17 (which we will designate as the lower surface 62) opposite to the above-mentioned upper surface 61, and are filled with elastic/flexible material. The further damping elements 56 are for shielding side portions of the piezoresistive sensitivity lobe of the sensor, i.e., for damping forces applied along directions forming predetermined angles with the sensor (which angles depend on the mutual geometric position of the sensor and the further damping elements). The resulting overall effect is that of increasing the sensitivity of the sensor in a certain direction, in order to improve the properties of directionality/directivity thereof, as desired, based on the mutual geometric positioning of the sensor and of these further damping elements.

Figure 5B:
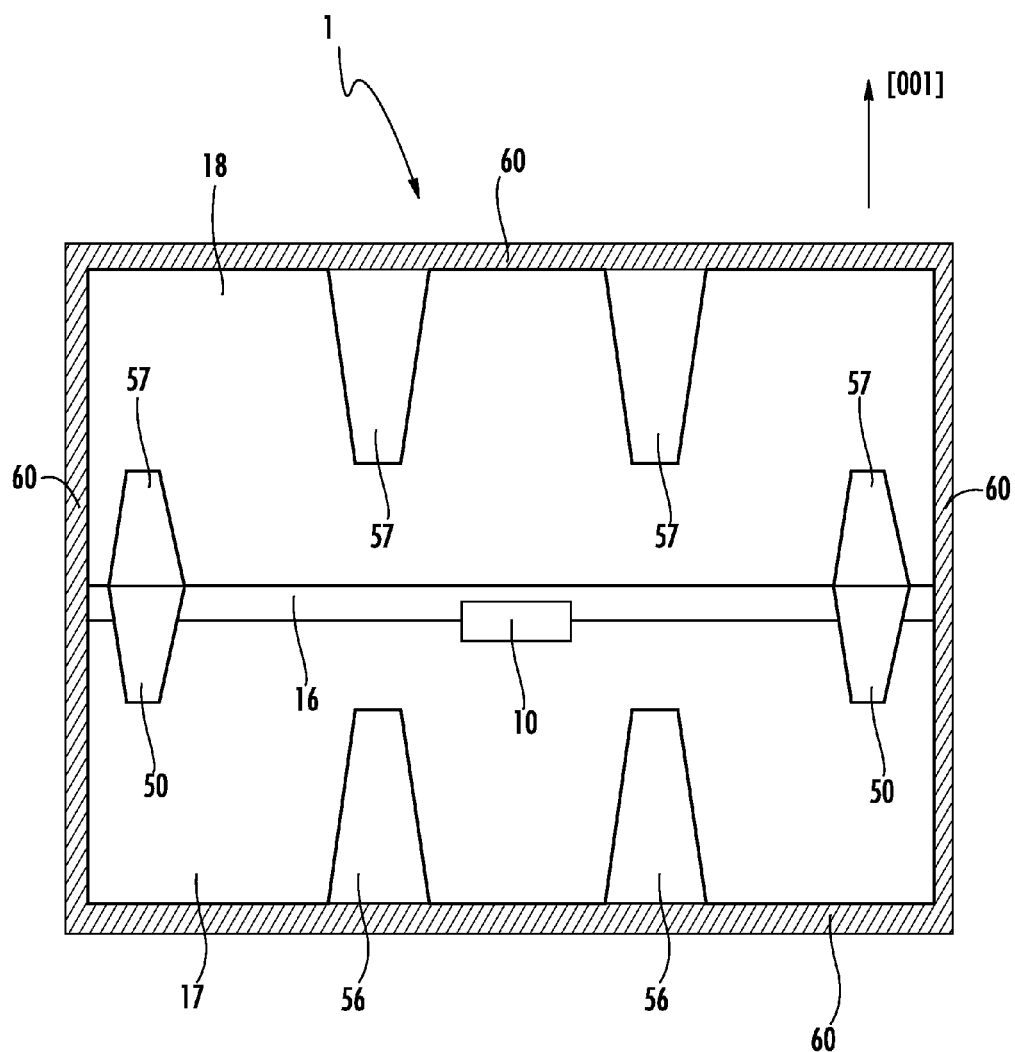

FIG. 5B shows a device 1 provided with further damping structures, which are intended to further improve the rejection of the forces acting in the directions other than the detection direction, and improve the directionality/directivity in the detection direction. To this purpose, the device 1 of FIG. 5B comprises a further substrate 18, which is positioned above the chip in which the device functional circuitry 10, and particularly the sensor 10, is provided. This further substrate 18 is provided of yet further damping elements 57, which are structurally similar to the damping elements that have been illustrated above. In the exemplary embodiment depicted in FIG. 5B, such further damping elements 57 are arranged in mirrored positions relative to the damping elements 50 and the further damping elements 56 of the device 1.

Figure 6:
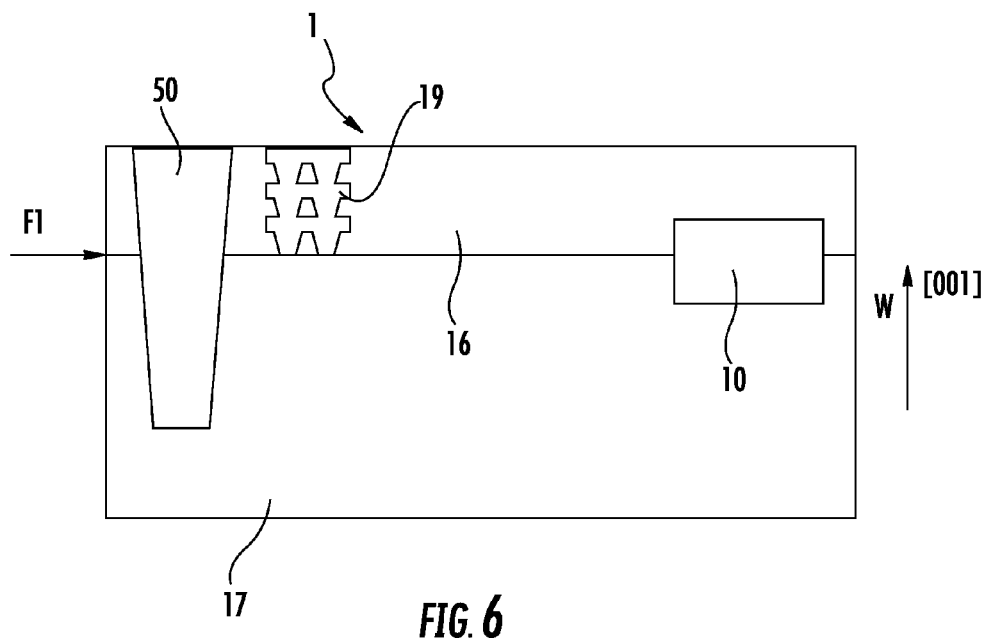
FIG. 6 is a cross-sectional view of a part of a device according to a further embodiment of the invention.

FIG. 6 shows a device 1 further comprising a seal ring 19 (only part of this ring can be seen, in section, as FIG. 6 only shows a detail of the device). As can be seen, in such an exemplary embodiment the damping element 50 is arranged outside of the seal ring 19, i.e., farther from the sensor than the seal ring. In a known manner, the seal ring can be formed from various metallization levels and ways interposed between these layers.

Figure 7:
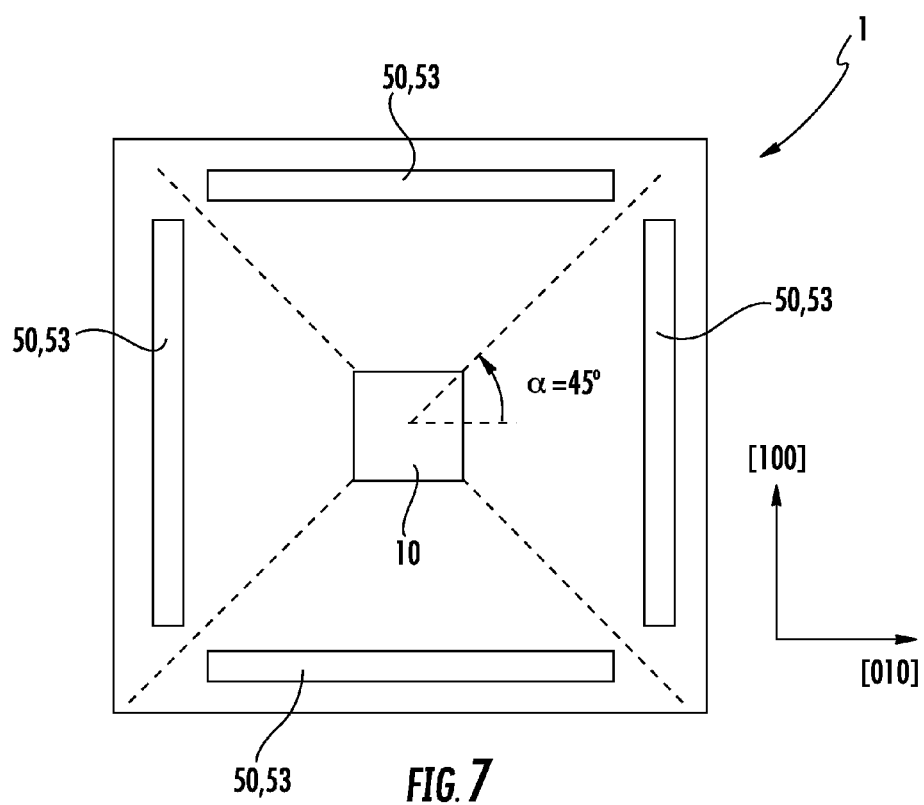
FIGS. 7, 8 and 9 are sectional top views (referring to a horizontal plane passing through the sensor), of respective embodiments of a device according to the invention.

FIG. 7 shows a top sectional view of the device 1, in an embodiment in which the at least one damping element 50 comprises four walls 53 of damping material, which are positioned along the perimeter of a rectangle about the sensor 10. As may be noticed, in this case, the frame around the sensor 10 is not continuous. However, the points where the frame is not present are those corresponding to angles in which the sensitivity of the sensor 10 is minimum, and has a negligible absolute value (angle $\phi=45'$; see also FIG. 1B, illustrated above). For this reason, the functionality of the damping elements 50 is not impaired and the functionality of the device is ensured, as in the other embodiments. The embodiment illustrated in FIG. 7 can be convenient because of the manufacturing simplicity thereof.

Figure 8:
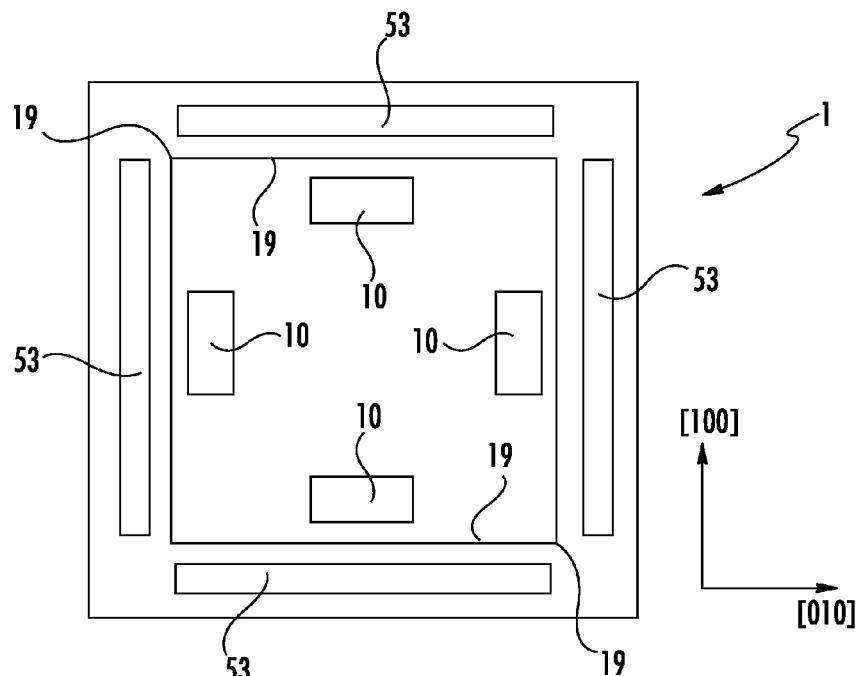

FIG. 8 illustrates a further embodiment of the device, in which the damping elements comprise walls 53, such as those illustrated in FIG. 7, within which a seal ring 19 is provided, within which several sensors 10 are arranged. The plurality of sensors 10, or the plurality of sensitive areas 10 which contribute to create a "distributed" sensor 10, are preferably positioned at each damping wall 53, in the vicinity of the device edge. Advantageously, this embodiment of the device allows for an improvement of the sensor functionality (in the case of a "distributed sensor"). In case of several sensors, the sensors can be orientated in different manners, e.g., to carry out several measurements or to achieve redundancy of sensors and extend the life of the detecting device 1.

Figure 9:
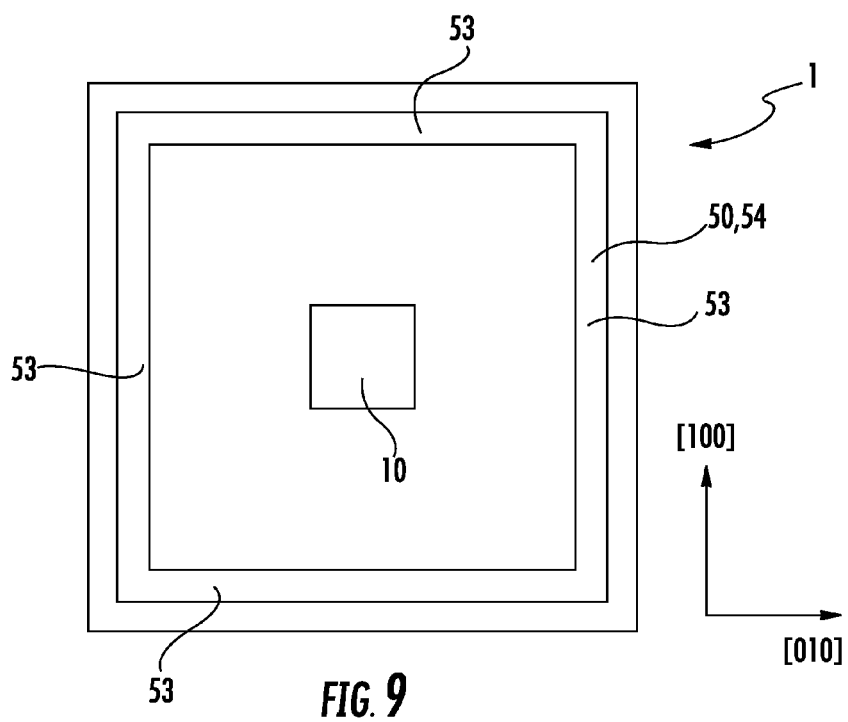

FIG. 9 illustrates a further embodiment of the device 1, in which the damping element comprises a continuous frame 54, around the sensor. In the example illustrated above, the frame 54 follows the perimeter of a square, but in other examples this cornice 54 can follow the perimeter of any (for example, ring-shaped, or octagonal, or hexagonal, or rectangular) polygon or loop.

Figure 10:
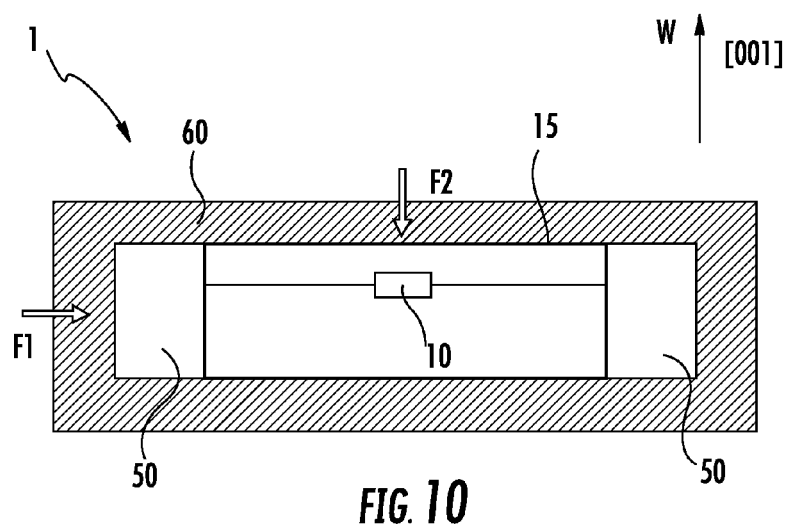
FIG. 10 is a cross-sectional view and FIG. 11 is a top sectional view of a device according to a further embodiment of the invention.
Figure 11:
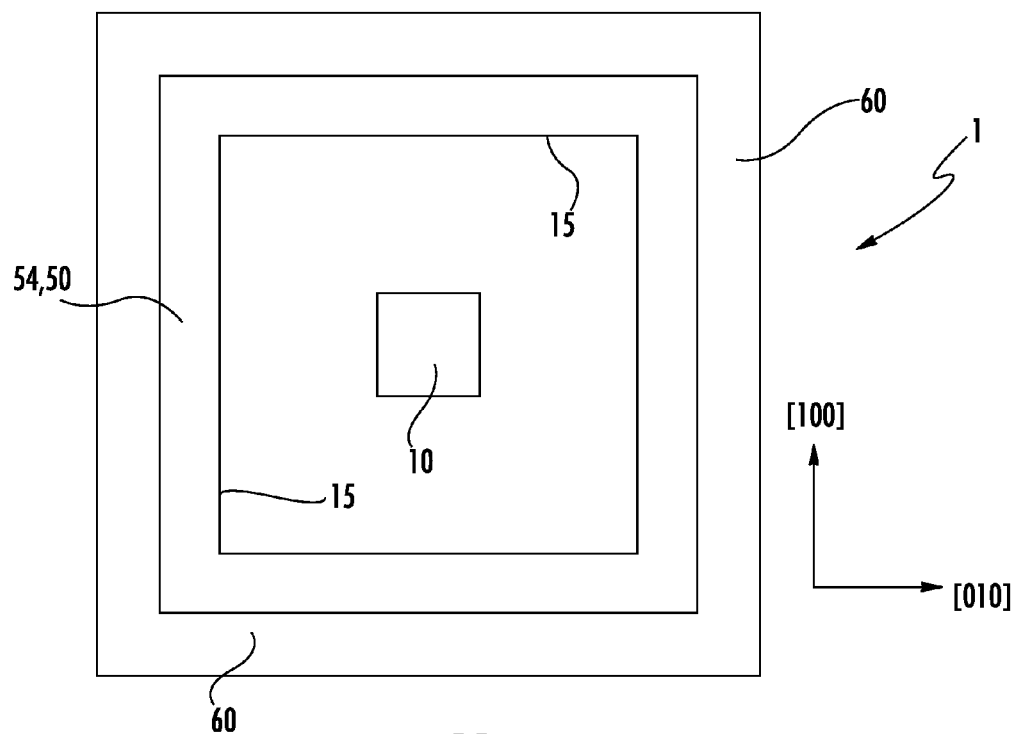

FIGS. 10 and 11 illustrate a further embodiment of the device 1, seen in lateral section and top section, respectively. In this case, the damping element 50 comprises a continuous frame, such as the one illustrated in FIG. 9. The presence of a frame of flexible/elastic material about the device 1 (i.e., in the peripheral part of the device 1) reduces the transmission of the lateral stress due to the force designated as $F_1$ in the substrate 17 where the sensor 10 is present. On the contrary, the lower and upper surfaces are exposed (they are not shielded by flexible/elastic material) and therefore transmit the force designated as $F_2$ to the device 1, thereby allowing the sensor 10 to measure the pressure and accordingly the force $F_2$ that is desired to be detected. In this embodiment, the whole device, comprising the damping frame 54, is embedded in a coating 60, for example made of building material.

Figure 12:
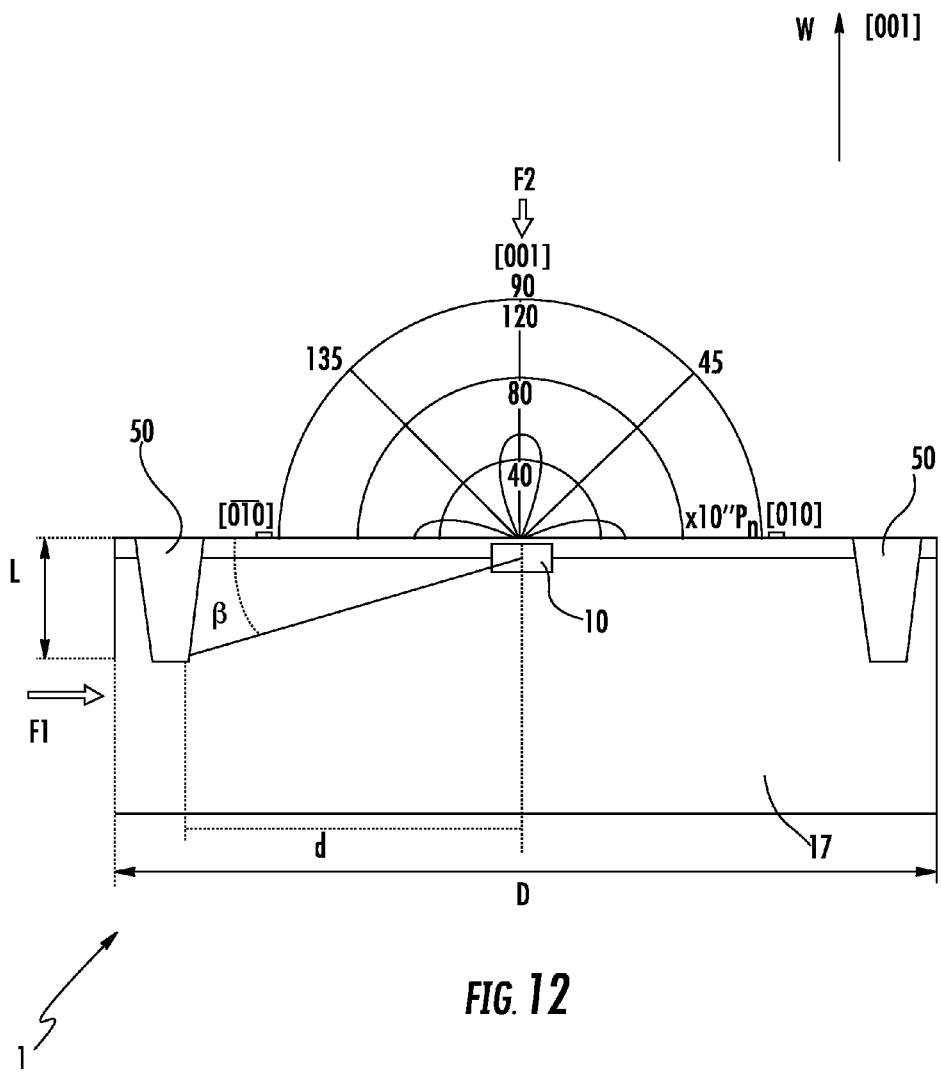
FIG. 12 is a cross-sectional view illustrating details of embodiments of the device of FIG. 3.

With reference to FIG. 12, some criteria for the design of the device 1 comprising one or more damping elements 50 will be outlined. The design criterion is based on the requirement that the whole lobe or at least the main part thereof of the sensitivity lobe of the sensor 10 should be shielded, i.e., intercepted, by the damping element 50. Thereby, the effect of the forces acting on a horizontal plane, and which would be experienced due to this sensitivity lobe (particularly, the effect of the "lateral" force $F_1$) is substantially reduced and possibly reduced to zero, due to the fact that these forces are absorbed by the damping element 50.

Now, since the opening angle of the lobe β is known (illustrated in FIG. 12 both in the upper half-plane, in which the sensitivity diagram is shown, and in the lower half-plane), the thickness L of the damping element 50 (i.e., the depth of the groove in which this damping element is provided) can be calculated as a function of the distance d between the sensor and the damping element.

Particularly, if the greater dimension of the chip, on which the device is manufactured, is designated with D, if it is assumed that the sensor is positioned substantially in the middle of the chip, along this greater dimension, and if it is assumed that the damping element is provided substantially at edge of the chip, the following approximate formula is easily obtained from trigonometric calculations:

$$L = d\,\tan(\beta)$$

wherein "tan" indicates the tangent function and β (the angle at which the sensitivity is reduced at the desired value), is ranging e.g., between 20° and 25°, and d is lower than D/2.

In other words, each of the damping elements 50 has a thickness L in the given direction w and is positioned at a distance d from sensor 10. The thickness L and the distance d are defined so that the lines joining the ends of the damping element 50 and the sensor 10 form an angle at least equal to an angle of minimum sensitivity β of the sensor 10 or at least equal to an angle β, such as to reduce the sensitivity to the desired value.

In the embodiment of FIG. 8, the plurality of sensors 10 is preferably positioned at each damping wall 53, and this allows to reduce the thickness L of the damping element 50 (the angle β remaining the same as in the previous example of FIG. 12), or to increase the angle β so as to further reduce and possibly minimize the sensitivity of the sensor 10, e.g., the angle β can range between 40° and 50°. The angle β can be further increased by the further damping elements 56 as shown in FIG. 5.

Figure 13:
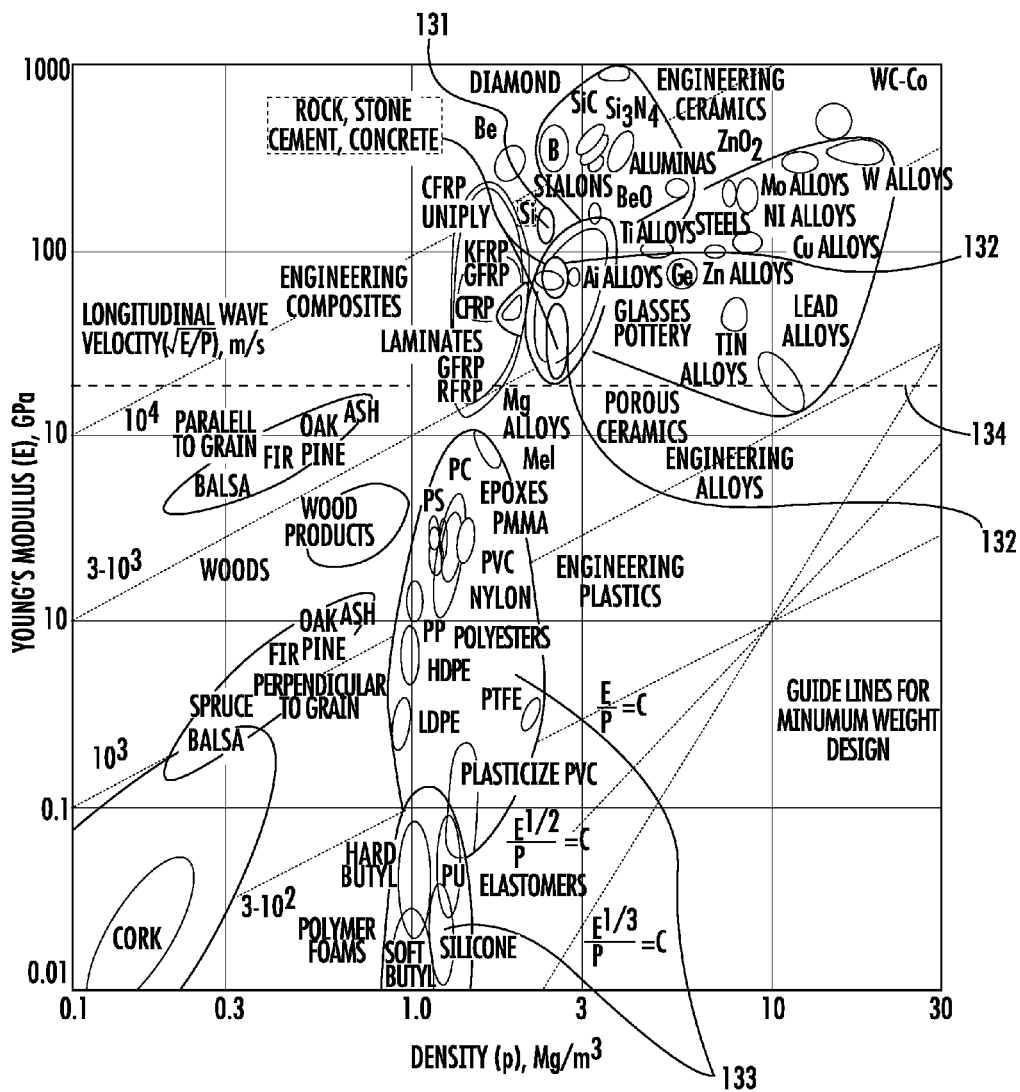
FIG. 13 is a perspective diagram illustrating the Young modulus and density of a number of materials, in which properties of interest of materials relevant to the present invention are shown.

With reference now to FIG. 13, more details will be provided on the flexible/elastic material forming the damping element or elements, which are comprised in the device according to the invention. The property of this material is that of absorbing, i.e., damping, i.e., reducing the forces acting thereon; hence, the definition thereof as an "elastic/flexible" material. The terms "elastic" and "flexible" will be considered as synonyms.

Particularly, such material shall be more elastic than the building material (e.g., reinforced concrete or stone) of the structure to be monitored, and, advantageously, also more elastic than the semiconductor (e.g., silicon) of which the sensor, the circuitry and the substrate of the detecting device are made. Due to the above, such material, and the damping element formed from this material, can withstand the long-term strains of the solid structure to be monitored, and can provide a damping function, as described above.

For a more rigorous definition of "elastic/flexible", reference should be made to the general diagram in FIG. 13 (well-known in the field of technologies of materials), which illustrates the modulus of elasticity or Young modulus (Y-axis) and the density (X-axis) of a number of materials. The Young modulus, as it is known, provides a measure of the stiffness of a material, and thus also of the flexibility/elasticity thereof.

The relevant parts of FIG. 13 are highlighted by a bold contour and numbered, particularly those areas in the plot that are designated with numeral 131 (Young modulus and density of silicon), with numeral 132 (small areas related to the Young modulus and density of concrete and of rock/stone) and with the numeral 133 (Young modulus and density of polymeric and elastomeric materials, in particular suitable for use as a flexible/elastic material for the damping elements of the device of the present invention). The materials comprised in the region 133 (for example polyesters, PVC, silicone, Teflon, Kapton, Polyimide, PEN, PET, epoxy resins, elastomers, rubber) have a lower Young modulus, even much lower, than the one of silicon and the one of the above-mentioned building materials, and further have a density that is not too dissimilar thereto. Therefore they are suitable for use in the present invention.

As a more general criterion, it can be said that those materials having a Young modulus lower than that of silicon and than that of building materials of the solid structures to be monitored (i.e., lower than the threshold indicated in FIG. 13 with a broken line 134) are suitable to be used for the damping elements 50.

Preferably, those materials having a Young modulus lower than 15 Gpa are suitable to be used for the damping elements 50. More preferably, those materials having a Young modulus lower than 10 Gpa are suitable to be used for the damping elements 50.

Figure 15:
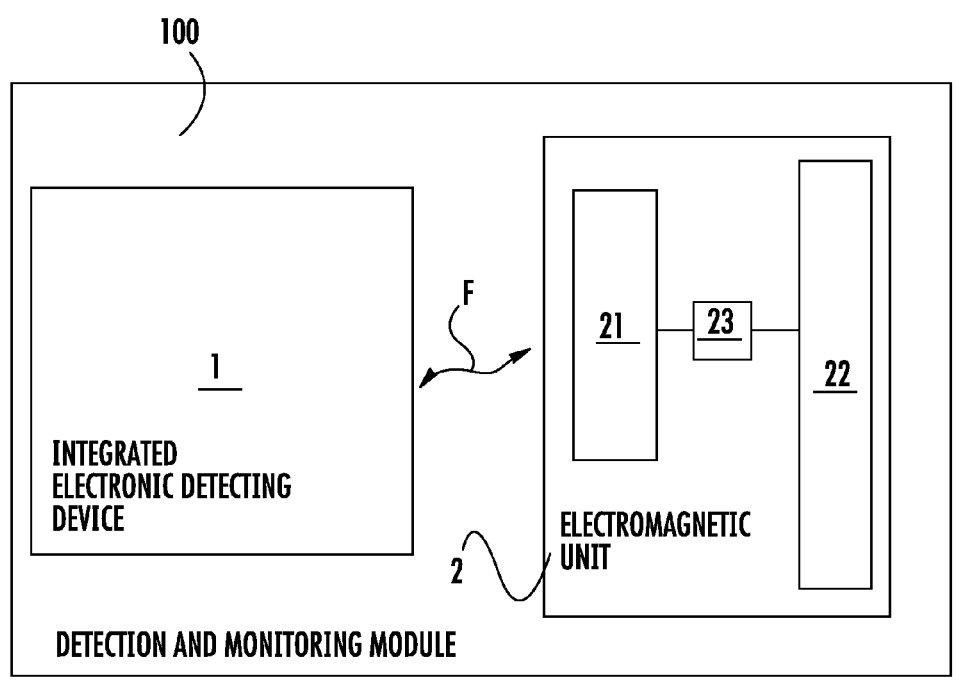
FIG. 15 is a functional block diagram of an embodiment of a detecting and monitoring module, according to the invention.

With reference to FIG. 15, a detection and monitoring module 100 will be described, which is also encompassed in the invention. This module 100 comprises a detecting device 1, according to any of the embodiments described above, and further comprises a electromagnetic unit or means 2 for transmitting/receiving signals for telecommunications and energy exchange between the integrated antenna 11 of the detecting device 1 and a remote antenna 221 (shown in FIG. 18); the electromagnetic unit 2 is fixedly connected to the detecting device 1. The integrated antenna 11, the electromagnetic unit 2 and the remote antenna 221 are operatively connected by magnetic or electromagnetic coupling in wireless mode.

The electromagnetic unit 2 fulfill the requirement of allowing a communication between the detecting device 1 and an external control and data collection system, which is remotely located, for example at a distance of a few centimeters or meters from the structure to be monitored and from the device 1. This implies the requirement of either far-field or near-field electromagnetic energy transmission, also in view of the attenuations caused by the solid structure, that the electromagnetic fields must pass through.

Due to these reasons, the integrated antenna 11 comprised in the detecting device 1 may not be capable, as such, to ensure a remote communication, because of inherent limitations that mainly result from the small size thereof. The electromagnetic unit 2 perform a function of electromagnetic expansion and concentration, i.e. of concentrating an external electromagnetic field, and the energy thereof, on the integrated antenna 11 of the detecting device 1; and, similarly, of expanding an electromagnetic field emitted by the integrated antenna 11, and the energy thereof, towards a remote antenna.

Particularly, the electromagnetic unit 2 comprises at least two antennas, a first antenna 21 and a second antenna 22, which are connected to each other by connection 23. The connection 23 can be for example a simple transmission line or other circuit.

The first antenna 21 communicates with the integrated antenna 11 of the integrated detection module 1, via electromagnetic fields, and preferably by magnetic field coupling (i.e. near-field magnetic coupling). The second antenna 22 communicates with a remote antenna, for example of the external control and data collection system, through coupling of electromagnetic fields (i.e., far-field electromagnetic coupling). Each of the first and second antennas 21, 22 can be a magnetic dipole or a Hertzian dipole or even another type of known antenna, as long as it is able to perform the functions described above.

Figure 16:
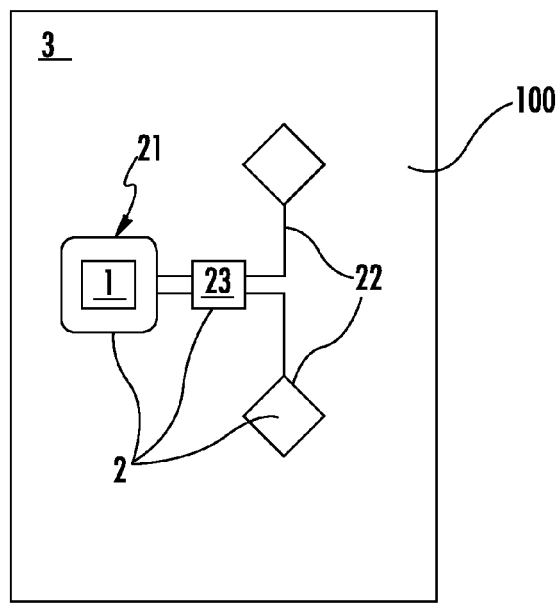
FIG. 16 is a schematic diagram illustrating the structure of the detecting and monitoring module of FIG. 15.

Reference will be now made to FIG. 16, which shows a detection and monitoring module 100 according to the invention from a structural point of view. In the embodiment illustrated in FIG. 16, the first antenna 21 of the electromagnetic unit 2 comprises a coil 21. The connection 23 of the electromagnetic unit 2 comprises an adaptation circuit 23, per se known. The second antenna 22 of the electromagnetic unit 2 comprises a Hertzian dipole antenna 22.

The coil 21 is positioned close to the detecting device 1 and extends around it, so as to magnetically couple with the integrated antenna 11. The currents induced by the integrated antenna 11 on the coil 21, which acts as a magnetic dipole, are transferred to the Hertzian dipole antenna 22. This transfer is preferably mediated by the adaptation circuit 23, which allows the overall performance of the electromagnetic means 2 to be improved.

As stated above, the second antenna 22 is in this case a Hertzian dipole suitable to "far-field" communication. The electromagnetic unit 2 are known per se. Further details on how they can be made can be found in the international patent application WO 2012/084295, of the present Assignee.

The detection and monitoring module 100 further comprises a support 3, for example made of polymeric material, on which the detecting device 1 and the electromagnetic unit 2 are placed, for example by gluing. Such support 3 has the main function of keeping the integrated detection module 1 and the electromagnetic unit 2 integral to each other, and further of keeping the detection and monitoring module 100 in a predetermined position within the structure to be monitored, as will be illustrated below.

Figure 17:
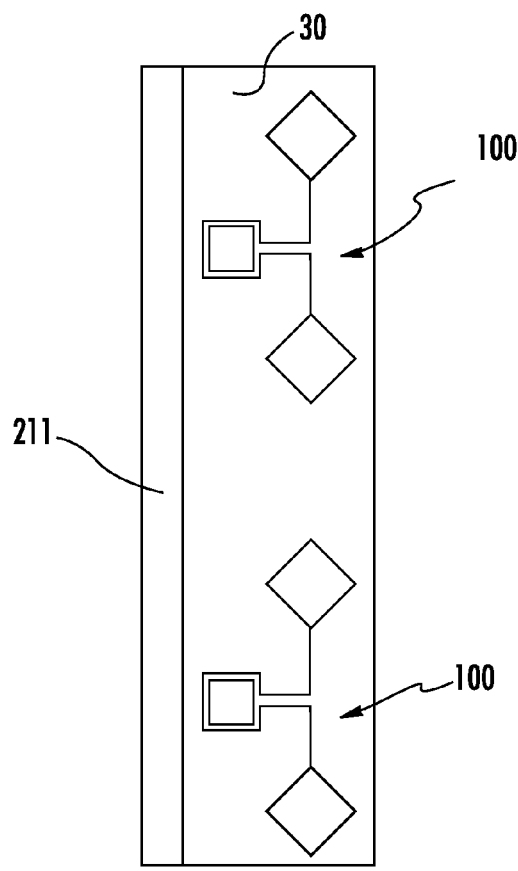
FIG. 17 is a schematic diagram illustrating a further embodiment of a detecting and monitoring module, according to the invention.

According to a variant embodiment, illustrated in FIG. 17, a support strip 30 of polymeric material is provided, such as to be fixed to a support structure 211, and suitable to accommodate, at predetermined distances and positions, a plurality of detection and monitoring modules 100. In a particular embodiment, also shown in FIG. 17, the detection and monitoring module 100 comprises at least two detection devices 1, each of them comprising a respective sensor 10, wherein one of the two sensors is configured to detect the force component acting in the given direction "w" and the other of the two sensors is configured to detect the force component acting in a plane perpendicular to the given direction "w" or however in a direction other than the given direction "w".

Figure 18:
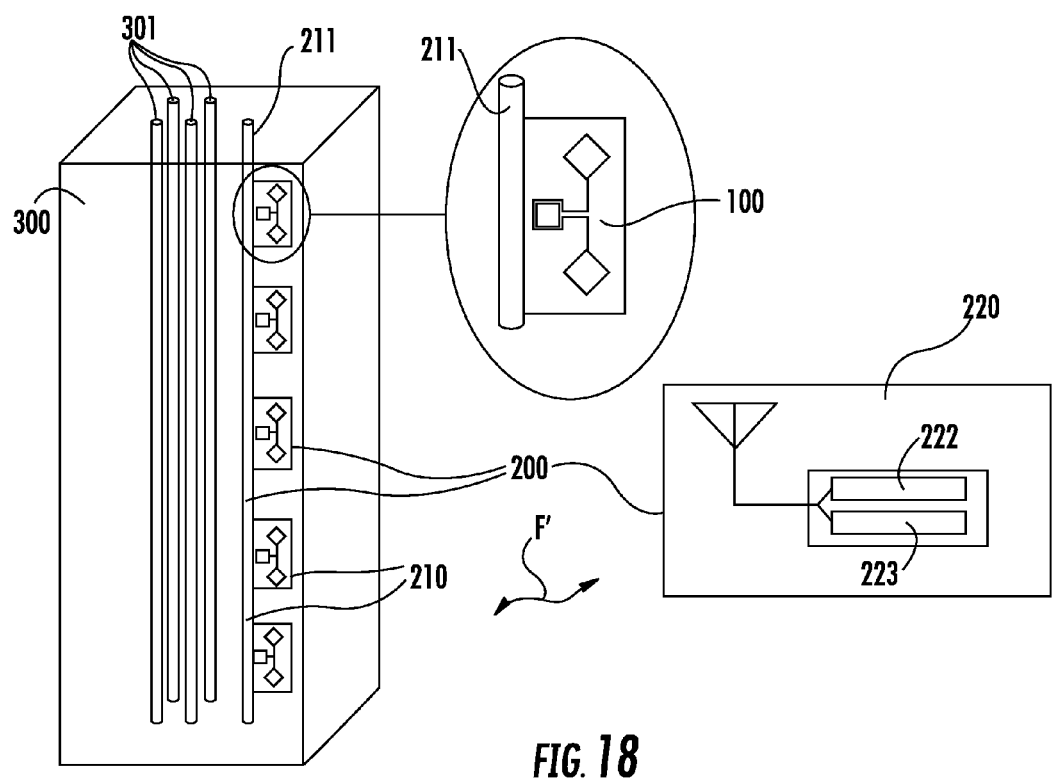
FIG. 18 is a schematic diagram illustrating a monitoring system according to an example of the invention.

With reference to FIG. 18, it is described a system 200 for monitoring one or more parameters in a plurality of points within a solid structure 300. This system 200 comprises an internal monitoring sub-system 210 placed within the solid structure 300; and an external control and data collection sub-system 220 located outside of and remote from the solid structure 300. The internal monitoring sub-system 210 comprises a support structure 211 passing through the points to be monitored within the solid structure 300, and further comprises a plurality of detection and monitoring modules 100, according to one of the embodiments described above. Each of this plurality of detection and monitoring modules 100 is fixed to the support structure 211 in a known and predetermined position.

The external control and data collection sub-system 220 comprises an external antenna 221, capable of electromagnetically communicating with the electromagnetic means 2 of the detection and monitoring modules 100; further comprises data collection, storage and processing means 222, suitable to receive, store and process data, representative of parameters to be monitored, coming from a plurality of detection and monitoring modules 100; and finally comprises power supplying and remote power supplying means 223, suitable to supply power energy to the external control and data collection sub-system 220 and remotely supplying power energy to the internal monitoring sub-system 210, through the external antenna 221.

In the example of FIG. 18, the structure to be monitored is a reinforced concrete pillar 300, comprising steel reinforcement rods 301, which can also be used as a support structure 211. Further details on the manner with which a detection and monitoring system 200 having the above-mentioned characteristics can be implemented can be found in the international patent application WO 2012/084295, of the Assignee.

As can be seen, the object of the present invention is achieved by the detecting device (as well as by the detection and monitoring module and by the monitoring system according to the invention), due to the characteristics thereof. In fact, the detecting device of the present invention allows for an accurate detection of every individual component of the force and/or pressure and/or mechanical stress that is present in a point to be monitored within a solid structure.

By orientating the sensor so as to align the axis of piezo-resistive sensitivity to a given direction in which the force is desired to be detected, an accurate result is obtained, which exactly measures the desired component, while the effects of the components acting on a plane perpendicular to this given direction result to be substantially attenuated and possibly reduced to zero (due to the structure of the device, particularly due the damping elements purposely provided). The given direction, along which the force is desired to be detected, can be any direction, particularly a vertical direction and a lateral (or horizontal) direction.

The monitoring module and system according to the invention are based on the device according to the invention, and benefit therefrom. Furthermore, both in the device and in the module, it is possible to provide several, differently orientated, sensors, so as to measure all the various components of the force, and, advantageously, separately from one another.

To the embodiments of the detecting device, and of the module and of the monitoring system described above, those skilled in the art, to meet contingent requirements, may carry out modifications, adaptations, and replacements of elements with others functionally equivalent also in conjunction with the prior art, also by creating hybrid implementations, without departing from the scope of the following claims. Each of the characteristics described as belonging to a possible embodiment can be carried out independently from the other embodiments described herein.

In addition, the crystalline axes can be rotated and the various structures and embodiments can be adapted according to such axes rotation.

That which is claimed:

1. An integrated electronic device for detecting a local parameter related to a force observed in a given direction, within a solid structure, and comprising:
at least one sensor configured to detect the local parameter at least in the given direction through piezo-resistive effect; and
at least one damping element having a plurality of walls, integrated in the integrated electronic device, arranged within a frame-shaped region disposed around the at least one sensor;
the at least one damping element being configured to damp forces not acting in the given direction.

2. The integrated electronic device according to claim 1, wherein the plurality of walls define a frame surrounding the at least one sensor.

3. The integrated electronic device according to claim 2, wherein the frame defines a laterally surrounding frame of the integrated electronic device.

4. The integrated electronic device according to claim 1, wherein the at least one damping element has a thickness in the given direction and is placed at a distance from the sensor, the thickness and the distance being defined so that lines joining ends of the at least one damping element and the at least one sensor form an angle corresponding to a reduced sensitivity angle of the at least one sensor.

5. The integrated electronic device according to claim 1, further comprising additional damping elements positioned in different regions with respect to the frame-shaped region, said additional damping elements being positioned so as to intercept side portions of a sensitivity lobe of the at least one sensor and to damp forces applied in directions corresponding to the side portions of the sensitivity lobe.

6. The integrated electronic device according to claim 1, wherein the at least one damping element comprises elastic material.

7. The integrated electronic device according to claim 6, wherein said elastic material has a lower stiffness than material of the solid structure to be monitored and than a semiconductor material of the at least one sensor.

8. The integrated electronic device according to claim 7, wherein said elastic material has a Young's modulus lower than 15 GPa.

9. The integrated electronic device according to claim 6, further comprising at least one groove within the frame-shaped region, and wherein the at least one damping element is defined by the elastic material in the at least one groove.

10. The integrated electronic device according to claim 1, wherein the device is manufactured on a single chip, and further comprising:
integrated operational circuitry, coupled to the at least one sensor, and comprising at least one integrated antenna and a functional surface facing outward of the single chip; and
a passivation layer coating at least said integrated operational circuitry to hermetically seal and galvanically insulate the integrated operational circuitry from a surrounding environment.

11. The integrated electronic device according to claim 10, wherein the passivation layer comprises at least one of silicon oxide, silicon nitride and silicon carbide.

12. A detection and monitoring module comprising:
a detecting device for detecting a local parameter related to a force observed in a given direction, within a solid structure, and comprising
a sensor configured to detect the local parameter at least in the given direction through piezo-resistive effect, and
at least one damping element, integrated in the detecting device, arranged within a frame-shaped region disposed around the sensor,
integrated operational circuitry, coupled to the sensor, and including an integrated antenna,
the at least one damping element being configured to damp forces not acting in the given direction; and
an electromagnetic unit configured to transmit/receive signals for telecommunications and energy exchange between the integrated antenna of the detecting device and a remote antenna, the electromagnetic unit being fixedly connected to the detecting device;
wherein the integrated antenna, the electromagnetic unit and the remote antenna are operatively connected through magnetic or electromagnetic coupling in a wireless mode.

13. The detection and monitoring module according to claim 12, further comprising an additional detecting device comprising an additional sensor configured to detect a force component acting in a plane perpendicular to the given direction.

14. The detection and monitoring module according to claim 12, wherein the at least one damping element comprises a plurality of walls positioned within the frame-shaped region.

15. The detection and monitoring module according to claim 14, wherein the walls define a frame surrounding the sensor.

16. The detection and monitoring module according to claim 12, wherein the at least one damping element comprises elastic material.

17. The detection and monitoring module according to claim 16, wherein the elastic material has a lower stiffness than material of the solid structure to be monitored and than a semiconductor material of the sensor.

18. A system for monitoring one or more parameters in a plurality of points within a solid structure, and comprising:
an internal monitoring sub-system positioned within the solid structure; and
an external control and data collection sub-system positioned outside of and remote from the solid structure;
the internal monitoring sub-system comprising a support structure passing through the plurality of points to be monitored within the solid structure, and further comprising a plurality of detection and monitoring modules, each of the plurality of detection and monitoring modules being fixed to the support structure at a respective position, and each comprising
a detecting device for detecting a local parameter related to a force observed in a given direction, within the solid structure, and comprising
a sensor configured to detect the local parameter at least in the given direction, and
at least one damping element, integrated in the detecting device, arranged within a frame-shaped region disposed around the sensor,
integrated operational circuitry, coupled to the sensor, and including an integrated antenna,
the at least one damping element being configured to damp forces not acting in the given direction, and
an electromagnetic unit configured to transmit/receive signals for telecommunications and energy exchange between the integrated antenna of the detecting device and a remote antenna, the electromagnetic unit being fixedly connected to the detecting device;

the external control and data collection sub-system comprising an external antenna, defining the remote antenna, configured to communicate with the electromagnetic unit of the plurality of detection and monitoring modules, a data collection, storage and processing unit configured to receive, store and process data from the plurality of detection and monitoring modules, the data being representative of parameters to be monitored, and a power supply configured to supply power energy to the external control and data collection sub-system and remotely supply power energy to the internal monitoring sub-system, through the external antenna.

19. The system according to claim 18, wherein the at least one damping element comprises a plurality of walls positioned within the frame-shaped region.

20. The system according to claim 19, wherein the walls define a frame surrounding the sensor.

21. The system according to claim 18, wherein the at least one damping element comprises elastic material.

22. The system according to claim 21, wherein the elastic material has a lower stiffness than material of the solid structure to be monitored and than a semiconductor material of the sensor.

23. A method for detecting a local parameter related to a force observed in a given direction, with an integrated electronic device within a solid structure, and comprising:

detecting the local parameter at least in the given direction through piezo-resistive effect with at least one sensor; and damping forces not acting in the given direction with at least one damping element having a plurality of walls, integrated in the integrated electronic device, arranged within a frame-shaped region disposed around the at least one sensor.

24. The method according to claim 23, wherein the walls define a frame surrounding the at least one sensor.

25. The method according to claim 23, wherein the at least one damping element comprises elastic material.

26. The method according to claim 23, further comprising forming at least one groove within the frame-shaped region, and wherein the at least one damping element is defined by elastic material in the at least one groove.

27. The method according to claim 23, wherein the device is manufactured on a single chip, and further comprising:

coupling integrated operational circuitry to the at least one sensor, and comprising at least one integrated antenna and a functional surface facing outward of the single chip; and coating at least said integrated operational circuitry with a passivation layer to hermetically seal and galvanically insulate the integrated operational circuitry from the surrounding environment.

* * * * *